(12) United States Patent
Choi et al.

(10) Patent No.: US 6,231,672 B1
(45) Date of Patent: May 15, 2001

(54) APPARATUS FOR DEPOSITING THIN FILMS ON SEMICONDUCTOR WAFER BY CONTINUOUS GAS INJECTION

(75) Inventors: Won-sung Choi; Sang-jin Lee, both of Kyungki-do (KR)

(73) Assignee: IPS Ltd. (KR)

( * ) Notice: Subject to any disclaimer, the term of this patent is extended or adjusted under 35 U.S.C. 154(b) by 0 days.

(21) Appl. No.: 09/313,632

(22) Filed: May 18, 1999

(30) Foreign Application Priority Data

May 18, 1998 (KR) .................................................. 98-17857

(51) Int. Cl.[7] .................................................. C23C 16/00
(52) U.S. Cl. ...................................... 118/715; 204/298.07
(58) Field of Search ........................ 118/715; 204/298.07

(56) References Cited

U.S. PATENT DOCUMENTS

| 4,388,342 | * | 6/1983 | Suzuki et al. ............................. 427/8 |
| 5,288,029 | * | 2/1994 | Ishibashi et al. ...................... 239/691 |
| 5,575,854 | * | 11/1996 | Jinnouchi et al. ...................... 118/715 |

FOREIGN PATENT DOCUMENTS 1-140712  6/1989 (JP) .
5-94949   7/1993 (JP) .

* cited by examiner

*Primary Examiner*—Jeffrie R. Lund
*Assistant Examiner*—Sylvia R. MacArthur
(74) *Attorney, Agent, or Firm*—Nixon & Vanderhye, PC; Frank P. Presta

(57) ABSTRACT

An apparatus for depositing thin films of a semiconductor device. The thin film deposition apparatus includes: a reactor maintained at a constant pressure; at least two reaction gas supply portions for supplying reaction gases to the reactor; an exhaust pump for discharging the gases out of the reaction gas supply portions and/or the reactor; first flow control valves installed between each reaction gas supply portion and the reactor, for controlling the amount of gases flowing between the reaction gas supply portions and the reactor; second flow control valves installed between each reaction gas supply portion and the exhaust pump, for controlling the amount of gases flowing between the reaction gas supply portions and the exhaust pump; an inert gas supply portion for supplying an inert gas into the reactor; reaction gas pipe lines, wherein the reaction gases provided from the reaction gas supply portions flow through the reaction gas pipe lines to the reactor and/or the exhaust pump; an inert gas pipe line, wherein the inert gas provided from the inert gas supply portion flows through the inert gas pipe line to the reactor; and a plurality of valves installed in the reaction gas pipe lines and/or the inert gas pipe lines, for controlling the amount of reaction gases and inert gas flowing into the reactor and/or the exhaust pump.

6 Claims, 2 Drawing Sheets

APPARATUS FOR DEPOSITING THIN FILMS ON SEMICONDUCTOR WAFER BY CONTINUOUS GAS INJECTION

BACKGROUND OF THE INVENTION

1. Field of the Invention

The present invention relates to an apparatus for depositing thin films on a wafer such as semiconductor substrate by continuous gas injection.

2. Description of the Related Art

Referring to FIG. 1, a conventional thin film deposition apparatus comprises a reaction gas transfer portion 100 for transferring a reaction gas into a reactor 200, and an exhaust portion 300 for exhausting the gas out of the reactor 200.

The reaction gas supply portion 100 comprises a first reaction gas supply portion 110 for supplying a first reaction gas to the reactor 200, a second reaction gas supply portion 120 for supplying a second reaction gas to the reactor 200, and an inert gas supply portion 130 for supplying an inert gas to the reactor 200. The exhaust portion 300 has an exhaust pump 310 for discharging the gas out of the reactor 200.

The gas supply portions 110, 120 and 130 and the exhaust pump 310 are connected by pipe lines having a plurality of on/off valves 111, 112, 113, 114, 115, 121, 122, 123, 124, 125, 131, 132, 133 and 134 which are controlled by a connector (not shown) connected to each of the valves.

The first reaction gas supply portion 110 includes a first source container 116 filled with a first liquid material as a source of the first reaction gas, and a mass flow controller (MFC) for controlling the flow of a transfer gas for transferring the first reaction gas to the reactor 200. The second reaction gas supply portion 120 includes a second source container 126 filled with a second liquid material as a source of the second reaction gas, and an MFC for controlling the flow of the transfer gas for transferring the second reaction gas to the reactor 200. The inert gas supply portion 130 comprises an inert gas container 136 for supplying the inert gas and an MFC for controlling the flow of the inert gas to the reactor 200.

In the thin film deposition apparatus having the above structure, for example, the valves 111, 112 and 113 are open, the transfer gas provided through a first supply line 11 and the valve 111 enters the reactor 200 together with the first reaction gas contained in the first source container 116 through the valves 112 and 113 and a first reactor pipe line 21.

Then, when the valves 114 and 115 are open, the transfer gas provided through the first supply line 11 is discharged through the valves 114 and 115, a first exhaust line 71 and the exhaust pump 310.

Then, when the valves 131, 132 and 134 are open, the inert gas flows into the reactor 200 through the first reactor pipe line 21 and a third reactor pipe line 23, so that the reaction gas remaining in the first reactor pipe line 21 and the reactor 200 is discharged.

Then, when the valves 132 and 134 are closed an) the valves 121, 122 and 123 are open, the transfer gas provided through a second supply line 12 and the valve 121 enters the reactor 200 together with the second reaction gas contained in the second source container 126 through the valves 122 and 123 and a second reactor pipe line 22.

However, when the valve 134 is closed in order to transfer another reaction gas to the reactor 200, the inert gas cannot be provided to the first reactor pipe line any more. Thus, the reaction gas remaining in the first reactor pipe line 21, not being discharged, is mixed with the next reaction gas. Also, when the valve 132 is closed, the reaction gas in a part of the reactor 200 near the exhaust line is not discharged, so that the remaining reaction gas is mixed with the next reaction gas.

On the other hand, when the valves are turned on/off in order to transfer another reaction gas, the internal pressure of the lines connected to the corresponding valves changes. Such a change in pressure means that a stable supply of the reaction gas is not certain and causes cavitation to the supply lines, so that the transfer of the reaction gas becomes difficult.

SUMMARY OF THE INVENTION

It,is an object of the present invention to provide an apparatus for depositing thin films on a semiconductor wafer, in which the gas flow through a reactor or an exhaust pump is controlled to be constant such that different reaction gases are not mixed in the reactor.

To achieve the object of the present invention, there is provided an apparatus for depositing thin films on a semiconductor wafer, comprising: a reactor maintained at a constant pressure; at least two reaction gas supply portions for supplying reaction gases to the reactor; an exhaust pump for discharging the gases out of the reaction gas supply portions and/or the reactor; first flow control valves installed between each reaction gas supply portion and the reactor, for controlling the amount of gases flowing between the reaction gas supply portions and the reactor; second flow control valves installed between each reaction gas supply portion and the exhaust pump, for controlling the amount of gases flowing between the reaction gas supply portions and the exhaust pump; an inert gas supply portion for supplying an inert gas into the reactor; reaction gas pipe lines, wherein the reaction gases provided from the reaction gas supply portions flow through the reaction gas pipe lines to the reactor and/or the exhaust pump; an inert gas pipe line, wherein the inert gas provided from the inert gas supply portion flows through the inert gas pipe line to the reactor; and a plurality of valves installed in the reaction gas pipe lines and/or the inert gas pipe lines, for controlling the amount of reaction gases and inert gas flowing into the reactor and/or the exhaust pump.

Preferably, the first and second flow control valves are metering valves or control valves installed before the valves between the reaction gas supply portions and the reactor, and between the reaction gas supply portions and the exhaust pump. Preferably, the bypass lines have an inner diameter of 0.1~0.5 mm, and the bypass lines have a length of 15~25 mm.

BRIEF DESCRIPTION OF THE DRAWINGS

The above object and advantages of the present invention will become more apparent by describing in detail a preferred embodiment thereof with reference to the attached drawings in which.

DESCRIPTION OF THE PREFERRED EMBODIMENT

Figure 1:
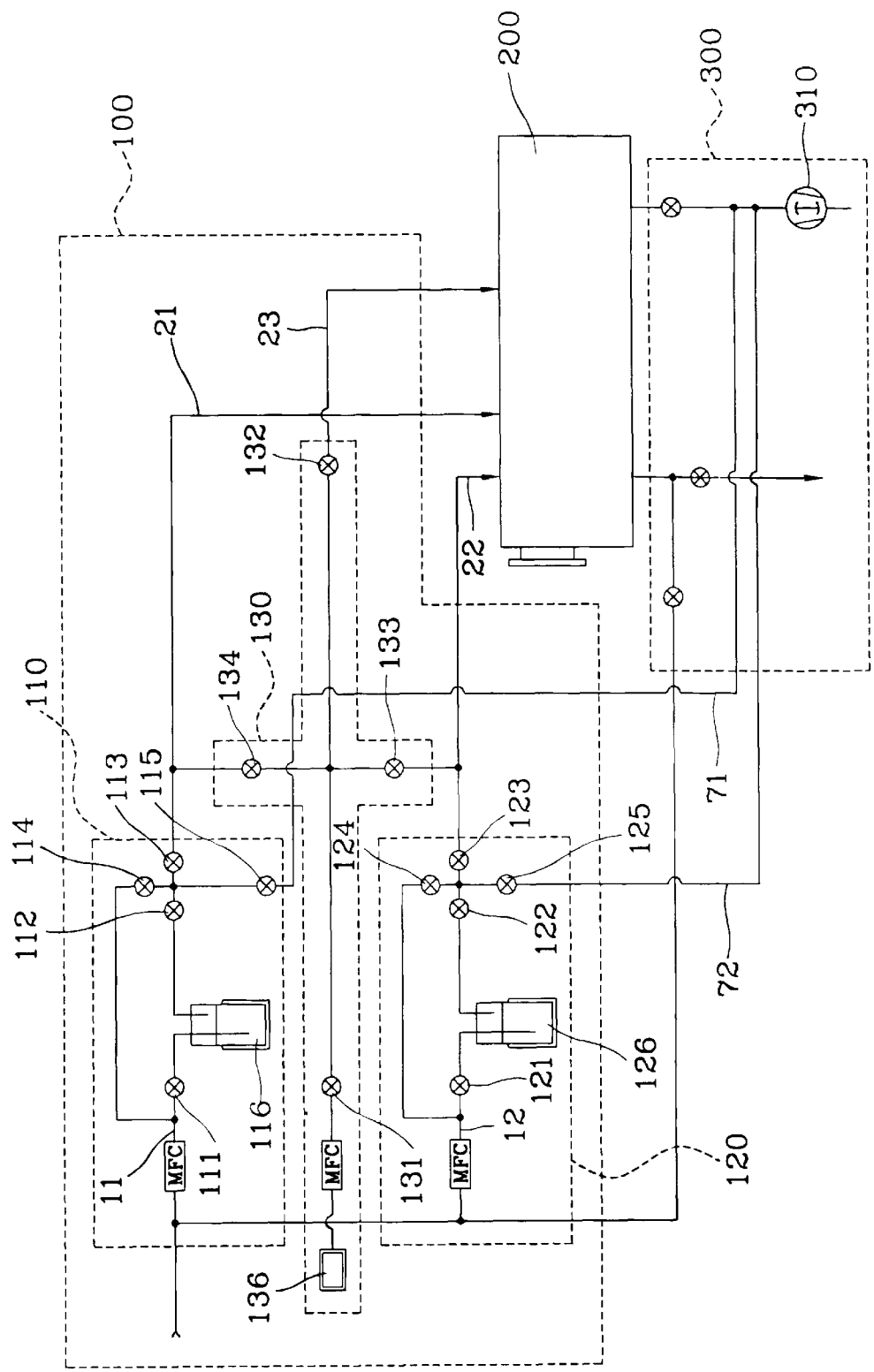
FIG. 1 is a piping diagram of a conventional apparatus for depositing thin films on a semiconductor wafer by continuous gas injection.
Figure 2:
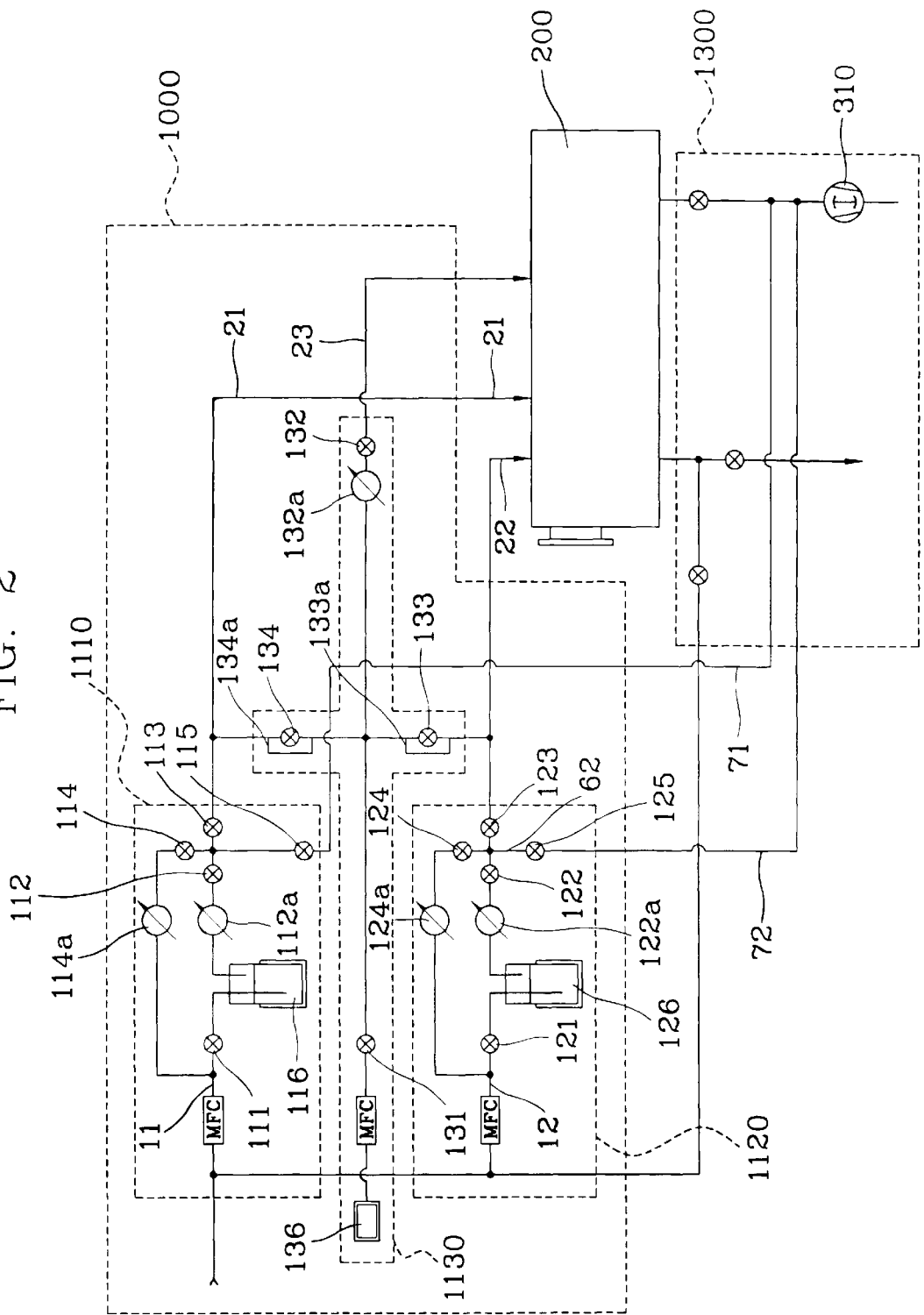
FIG. 2 is a piping diagram of an apparatus for depositing thin films on a semiconductor wafer through continuous gas injection according to the present invention.

Referring to FIG. 2, a thin film deposition apparatus according to the present invention comprises a reaction gas transfer portion 1000 for transferring a reaction gas to a reactor 200, the internal pressure of which is maintained at a constant level, and an exhaust portion 1300 for discharging the gas out of the reactor 200. Here, reference numerals the same as those in FIG. 1 represent the same elements.

The reaction gas transfer portion 1000 comprises a first reaction gas supply portion 1110 for supplying a first reaction gas to the reactor 200, a second reaction gas supply portion 1120 for supplying a second reaction gas to the reactor 200, and an inert gas supply portion 1130 for supplying an inert gas to the reactor 200. The exhaust portion 1300 has an exhaust pump 310 for discharging the gas out of the reactor 200.

The first, second and third gas supply portions 1110, 1120 and 1130, and the exhaust pump 310 are connected by pipe lines having a plurality of on/off valves 111, 112, 113, 114, 115, 121, 122, 123, 124, 125, 131, 132, 133 and 134 which are controlled by a connector (not shown) connected to each of the valves.

The first reaction gas supply portion 1110 includes a first source container 116 filled with a first liquid material as a source of the first reaction gas, a mass flow controller (MFC) for controlling the flow of a transfer gas for transferring the first reaction gas to the reactor 200, a first flow control valve 112a installed between the first source container 116 and the valve 112, and a second flow control valve 114a installed between the MFC and the valve 114. Here, the first and second flow control valves 112a and 114a continuously control the flow of the gas, thereby raising or maintaining the pressure of the gas flowing in the reactor 200 at a constant level.

The second reaction gas supply portion 1120 includes a second source container 126 filled with a second liquid material as a source of the second reaction gas, an MFC for controlling the flow of the transfer gas for transferring the second reaction gas to the reactor 200, a first flow control valve 122a installed between the second source container 126 and the valve 122, and a second flow control valve 124a installed between the MFC and the valve 124. Here, the first and second flow control,valves 122a and 124a continuously control the flow of the gas, thereby raising or maintaining the pressure of the gas flowing in the reactor 200 at a constant level.

The inert gas supply portion 1130 comprises an inert gas container 136 for supplying the inert gas, an MFC for controlling the flow of the inert gas to the reactor 200, a third flow control valve 132a installed between the valves 131 and 132, a bypass line 133a connected to both ends of the valve 133, and a bypass line 134a connected to both ends of the valve 134. Here, the third flow control valve 132a continuously controls the flow of the inert gas, thereby raising or maintaining the pressure of the inert gas flowing in the reactor 200 at a constant level. The bypass lines 133a and 134a have a diameter of 0.1~0.5 mm and a length of 15~25 mm.

The bypass lines 133a and 134a installed respectively around the valves 133 and 134 allow the inert gas to continuously flow in the reactor 200 through the first and second reactor pipe lines 21 and 22 even when the valves 133 and 134 are closed, such that the reaction gas remaining in the first and second reactor pipe lines 21 and 22 flows into the reactor 200. Also, the third flow control valve 132a increases the amount of inert gas flowing into the reactor 200, thereby completely discharging the reaction gas remaining in the reactor 200 and the reaction gas in the first and second reactor pipe lines 21 and 22.

Preferably, the first, second and third flow control valves 112a, 114a, 122a and 124a of the first and second gas supply portions 1110 and 1120, and the third flow control valve 132a of the third gas supply portion 1130 are a metering valve or a control valve. Also, the first, second and third flow control valves 112a, 114a, 122a, 124a and 132a may be installed before the valves 112, 114, 122, 124 and 132, respectively, and the distance between each flow control valve and each valve may be the shortest. This is for controlling the amount of flowing gas under a constant internal pressure and for maintaining the internal pressure. The flow control valves 112a, 114a, 122a, 124a and 132a control the amount of flowing gas by increasing or decreasing the sectional area of the pipe lines through which the gases flow.

In the thin film deposition apparatus, for example, when the valves 111, 112 and 113 are open, the transfer gas provided through a first supply line 11 and the valve 111 flows into the reactor 200 together with the first reaction gas from the first source container 116 through the first flow control valve 112a, the valves 112 and 113 and the first reactor pipe line 21.

Then, when the valves 114 and 115 are open, the transfer gas provided through the first supply line 11 is discharged through the second flow control valve 114a, the valves 114 and 115, the first exhaust line 71 and the exhaust pump 310. Here, the first and second flow control valves 112a and 114a continuously control the flow of the transfer gas, thereby raising or maintaining the pressure of the gas flowing in the reactor 200 at a constant level. Also, the pressure of the gas flowing in the reactor 200 becomes equal to that of the gas flowing into the exhaust pump 310.

Thereafter, the inert gas flows into the reactor 200 through the valves 131 and 134 and the first reactor pipe line 21, and through the valve 131, the third flow control valve 132a, the valve 132 and a third reactor pipe line 23, thereby discharging the reaction gas remaining in the first reactor pipe line 21 and the reactor 200.

Then, the transfer gas pipelined by a second supply line 12 and the valve 121 flows into the reactor 200 together with the second reaction gas from the second source container 126 through the first control valve 122a, the valves 122 and 123 and the second reactor pipe line 22. Then, the transfer gas is discharged through the second flow control valve 124a, the valves 124 and 125 and the exhaust pump 310. Here, the first and second flow control valves 122a and 124a continuously control the flow of the transfer gas, thereby raising or maintaining the pressure of the gas flowing in the reactor 200 at a constant level. Also, the pressure of the gas flowing in the reactor 200 becomes equal to that of the gas flowing into the exhaust pump 310.

Thereafter, the inert gas flows into the reactor 200 through the valves 131 and 133 and a second reactor pipe line 22, and through the valve 131, the third flow control valve 132a, the valve 132 and the third reactor pipe line 23, thereby discharging the reaction gas remaining in the second reactor pipe line 21 and the reactor 200.

Here, when the valve 133 or 134 is closed, the inert gas continuously flows in the first supply line 21 or the second supply line 22 through the bypass valves 133-a and 134a. Thus, the reaction gas remaining in the first and second supply lines 21 and 22 completely flows into the reactor 200, and then is discharged out of the reactor 200 together with the inert gas provided through the third flow control valve 132a and the valve 132.

As described above, in the case in which the valve 133 or 134 is closed in order to transfer another reaction gas to the reactor 200, the inert gas can flow into the reactor 200 through the bypass line 133a and 134a, so that the reaction gas remaining in the first reactor pipe line 21 or the second reactor pipe line 22 can completely flow into the reactor 200. Also, the reaction gas is completely discharged out of the reactor 200 together with the inert gas in the third supply line 23, so that the reaction gas is not mixed with the next reaction gas.

Also, in the case in which the valves are turned on/off in order to transfer another reaction gas, the flow of gas can be continuously controlled by the flow control valves, so that cavitation in the pipe lines due to a change in pressure is prevented. Accordingly, the reaction gas can flow continuously.

In addition, the first and second flow control valves can control the flow of transfer gas, so that the pressure of the gases in the reactor and the exhaust gas can be maintained at a constant level. Thus, even though the pressure over the pipe lines is not equal due to specifications of elements of the thin film deposition apparatus (e.g., volume of reactor, inner diameter of pipe line and length of pipe line), the flow of reaction gas can be maintained at a constant level.

As described above, the thin film deposition apparatus, through a continuous gas injection according to the present invention, can control the flow of reaction gas and inert gas to keep a constant level by adopting flow control valves and bypass lines. Also, the mixing of different reaction gases in a reactor can be prevented.

What is claimed is:

1. An apparatus for depositing thin films on a semiconductor wafer, comprising:

a reactor maintained at a constant pressure; t least two reaction fluid supply portions for supplying reaction gases to the reactor;

an exhaust pump for discharging the gases out of the reaction fluid supply portions and/or the reactor;

first flow control valves installed between each reaction fluid supply portion and the reactor, for controlling the amount of gases flowing between the reaction fluid supply portions and the reactor;

second flow control valves installed between each reaction fluid supply portion and the exhaust pump, for controlling the amount of gases flowing between the reaction fluid supply portions and the exhaust pump;

an inert gas supply portion for supplying an inert gas into the reactor;

reaction gas pipe lines, wherein the reaction gases provided from the reaction fluid supply portions flow through the reaction gas pipe lines to the reactor and/or the exhaust pump;

an inert gas pipe line, wherein the inert gas provided from the inert gas supply portion flows through the inert gas pipe line to the reactor;

a plurality of valves installed in the reaction gas pipe lines and/or the inert gas pipe lines, for controlling the amount of reaction gases and inert gas flowing into the reactor and/or the exhaust pump; and bypass lines connected to both ends of the valves placed between the inert gas supply portion and the reaction gas pipe lines to allow the inert gas to flow slowly through the reaction gas pipe lines even when the valves are closed to enable reaction gases remaining in the reaction gas pipe lines to flow to the reactor.

2. The apparatus of claim 1, wherein the first and second flow control valves are metering valves installed before the valves between the reaction fluid supply portions and the reactor, and between the reaction fluid supply portions and the exhaust pump.

3. The apparatus of claim 1, further comprising a third flow control valve installed between the inert gas supply portion and the reactor, for controlling the amount of the inert gas flowing between the inert gas supply portion and the reactor.

4. The apparatus of claim 3, wherein the third flow control valve is a metering valve installed before the valve placed between the inert gas supply portion and the reactor.

5. The apparatus of claim 1, wherein the bypass lines have an inner diameter of 0.1~0.5 mm.

6. The apparatus of claim 5, wherein the bypass lines have a length of 15~25 mm.

* * * * *